(12) United States Patent  
Hashim et al.

(10) Patent No.: US 9,129,894 B2  
(45) Date of Patent: Sep. 8, 2015

(54) EMBEDDED NONVOLATILE MEMORY ELEMENTS HAVING RESISTIVE SWITCHING CHARACTERISTICS

(71) Applicants: Imran Hashim, Saratoga, CA (US);  
Tony Chiang, Campbell, CA (US);  
Vidyut Gopal, Sunnyvale, CA (US);  
Yun Wang, San Jose, CA (US)

(72) Inventors: Imran Hashim, Saratoga, CA (US);  
Tony Chiang, Campbell, CA (US);  
Vidyut Gopal, Sunnyvale, CA (US);  
Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 474 days.

(21) Appl. No.: 13/621,371

(22) Filed: Sep. 17, 2012

(65) Prior Publication Data

US 2014/0078808 A1  Mar. 20, 2014

(51) Int. Cl.
*G11C 11/21* (2006.01)
*H01L 27/24* (2006.01)
*G11C 13/00* (2006.01)
*H01L 45/00* (2006.01)

(52) U.S. Cl.
CPC ........ *H01L 27/2436* (2013.01); *G11C 13/0007* (2013.01); *G11C 13/0069* (2013.01); *H01L 45/08* (2013.01); *H01L 45/1233* (2013.01); *H01L 45/146* (2013.01); *G11C 2213/32* (2013.01); *G11C 2213/51* (2013.01); *G11C 2213/52* (2013.01); *G11C 2213/74* (2013.01); *G11C 2213/79* (2013.01)

(58) Field of Classification Search
None
See application file for complete search history.

(56) References Cited

U.S. PATENT DOCUMENTS

| | | | |
|---|---|---|---|
| 8,039,383 B2 | 10/2011 | Lazovsky | |
| 8,354,660 B2 | 1/2013 | Sekar | |
| 8,362,454 B2 | 1/2013 | Lee | |
| 2006/0108625 A1* | 5/2006 | Lee et al. | 257/310 |
| 2006/0255392 A1 | 11/2006 | Cho et al. | |
| 2010/0136313 A1 | 6/2010 | Shimizu | |
| 2010/0258782 A1* | 10/2010 | Kuse et al. | 257/4 |
| 2011/0227026 A1 | 9/2011 | Sekar | |
| 2014/0289457 A1* | 9/2014 | Catthoor et al. | 711/103 |

OTHER PUBLICATIONS

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

(Continued)

*Primary Examiner* — James G Norman (57) ABSTRACT

Provided are nonvolatile memory assemblies each including a resistive switching layer and current steering element. The steering element may be a transistor connected in series with the switching layer. Resistance control provided by the steering element allows using switching layers requiring low switching voltages and currents. Memory assemblies including such switching layers are easier to embed into integrated circuit chips having other low voltage components, such as logic and digital signal processing components, than, for example, flash memory requiring much higher switching voltages. In some embodiments, provided nonvolatile memory assemblies operate at switching voltages less than about 3.0V and corresponding currents less than 50 microamperes. A memory element may include a metal rich hafnium oxide disposed between a titanium nitride electrode and doped polysilicon electrode. One electrode may be connected to a drain or source of the transistor, while another electrode is connected to a signal line.

20 Claims, 9 Drawing Sheets

(56) References Cited

OTHER PUBLICATIONS

Chen, Y.S., et al.; Highly Scalable Hafnium Oxide Memory with Improvements of Resistive Distribution and Read Disturb Immunity; Jan. 1, 2009; Industrial Technology Research Institute; pp. IEDM09108.

Gouil, A., et al.; PolySiTiNFfo[sub 2] Gate Stack Etching in HighDensity Plasmas; Jan. 1, 2007; Z-Book-Author; Journal of Vacuum Science and Technology B Microelectronics and Nanometer Structures vol. 25 No. 3. 2007 pp. 767778.

Kim, K., et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US) ; Applied Physics Letters pp. 9092.

Frank, Martin M; Highk Metal Gate Innovations Enabling Continued CMOS Scaling; Jan. 1, 2011; IEEE; IBM T.J. Watson research Center.

Vallee, C. et al.; High j for MIM and RRAM applications Impact of the metallic electrode and oxygen vacancies; Jan. 1, 2009; Elsevier Sequoia; Microelectronic Engineering 86 17741776.

Tkachev, Y., et al.; FloatingGate CornerEnhanced PolytoPoly Tunneling in SplitGate Flash Memory Cells; Jan. 1, 2012; IEEE; IEEE Transactions on Electron Devices vol. 59 No. 1 pp. 511.

Yan et al.; Graphene quilts for thermal management of highpower GaN transistors; May 8, 2012; Nature Communications.

Li et al.; Integration of Resistive Switching Memory Cell with Vertical Nanowire Transistor; Jan. 1, 2012; World Academy of Science, Engineering and Technology.

Wong et al.; MetalOxide RRAM May 2, 2012; IEEE.

* cited by examiner

EMBEDDED NONVOLATILE MEMORY ELEMENTS HAVING RESISTIVE SWITCHING CHARACTERISTICS

TECHNICAL FIELD

The present invention relates generally to semiconductor processing and more specifically to embedded nonvolatile memory elements having resistive switching characteristics.

BACKGROUND

Nonvolatile memory is computer memory capable of retaining the stored information even when unpowered. Nonvolatile memory is typically used for the task of secondary storage or long-term persistent storage and may be used in addition to volatile memory, which loses the stored information when unpowered. Nonvolatile memory can be formed into standalone memory circuits (e.g., USB flash drives) or may be embedded into integrated circuits containing other non-memory components, such as logic. Nonvolatile memory is becoming more popular because of its small size/high density, low power consumption, fast read and writes rates, retention, and other characteristics.

Flash memory is a common type of modifiable nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and writing times. Flash memory also suffers from low endurance, high power consumption, and some scaling limitations. In particular, flash memory generally requires higher operating voltages than other IC components, such as logic, making its embedding into chips particularly difficult. Additionally, flash memory requires many processing steps, which make it difficult to integrate with logic circuits for embedded applications.

SUMMARY

Provided are nonvolatile memory assemblies each including a resistive switching layer and current steering element. The steering element may be a transistor connected in series with the switching layer. Resistance control provided by the steering element allows using switching layers requiring lower switching voltages and currents. Memory assemblies including such switching layers are easier to embed into integrated circuit chips having other low voltage components, such as logic and digital signal processing components, than, for example, flash memory requiring much higher switching voltages. In some embodiments, provided nonvolatile memory assemblies operate at switching voltages less than about 3.0V and corresponding currents less than 100 microamperes. A memory element may include a metal rich hafnium oxide disposed between a titanium nitride electrode and doped polysilicon electrode. One electrode may be connected to a drain or source of the transistor, while another electrode is connected to a signal line.

In some embodiments, a nonvolatile memory assembly includes multiple signal lines, nonvolatile memory element, and transistor. The signal lines may include a bit line, word line, and source line. The signals lines are used to apply voltage potentials to various components of the nonvolatile memory assemblies and may be connected to an external control circuitry or other components of an IC chip into which the nonvolatile memory assemblies are embedded. The nonvolatile memory element may include a first layer operable as a first electrode, second layer operable as a second electrode, and third layer provided between the first and second layers. The first layer may include titanium nitride. This layer may be connected to the bit line to maintain a specific potential at the first layer and drive an electrical current through the third layer as further discussed below. The second layer may include polysilicon, which may be n-doped or p-doped polysilicon. In some embodiments, a concentration of one or more dopants in polysilicon may be between about $10^{19}$ and $10^{20}$ atoms per centimeter cubed. The third layer may include hafnium oxide or other suitable metal oxide having oxygen vacancies. In general, materials with other types of defects may be used as well. The oxygen vacancies (or other defects) provide resistive switching characteristics to the oxide. In some embodiments, hafnium oxide of the third layer has a stoichiometric formula of $HfO_x$ with X being between 1.7 and 1.9. The transistor of the assembly includes a source electrically connected to the source line, gate electrically connected to the word line, and drain electrically connected to the second layer of the nonvolatile memory element.

In some embodiments, the third layer (i.e., the resistive switching layer in the above example) has a thickness of between 15 Angstroms and 100 Angstroms. The second layer (i.e., the polysilicon electrode in the above example) may have a thickness of between about 100 Angstroms and 2,000 Angstroms. The first layer (i.e., the titanium nitride electrode in the above example) may have a thickness of between about 100 Angstroms and 1,000 Angstroms. The entire nonvolatile memory element may have a thickness of between about 250 Angstroms and 5,000 Angstroms. In some embodiments, the nonvolatile memory element may include other layers in addition to the three layers described above.

In some embodiments, the second layer includes a sublayer containing silicon oxide at an interface with the third layer. The first layer may be connected to the bit line using a conductive contact formed from, for example, tungsten. In this case, the memory element may include a diffusion barrier layer provided between the first layer and the contact. In some embodiments, the contact may be formed from conductive (e.g., heavily doped) polysilicon. The bit, word, and source lines may be provided within the same interlayer dielectric layer and, in some embodiments, the same plane. The signal lines may be made of copper, aluminum, or tungsten.

In some embodiments, the resistance between the source and drains of the transistor is controllable between about 1 kOhm and 1 MOhm or, more specifically, between about 10 kOhm and 100 kOhm or, more specifically by applying a voltage to the transistor gate or the word line. This resistance range is specifically tuned for particular voltage ratings and designs of nonvolatile memory elements. In some embodiments, hafnium oxide is configured to change its resistivity state when a switching voltage of less than 3.0V is applied to the third layer. It should be noted that the voltage is applied to the third layer by applying a corresponding voltage to bit and source lines and controlling the potential of the word line to open a channel between the source and drain in the transistor.

In some embodiments, a nonvolatile memory assembly includes a set of signal lines, nonvolatile memory element, first transistor, and second transistor. The set of signal lines includes a bit line, first word line, second word line, first source line, and second source line. The nonvolatile memory element includes a first layer operable as a first electrode, second layer operable as a second electrode, third layer operable as a resistive switching layer and provided between the first layer and second layer. The first layer may include titanium nitride and may be connected to the bit line. The second layer may include polysilicon. The third layer including hafnium oxide having oxygen vacancies. The features of the first, second, and third layers are described above and elsewhere in this document.

In this example, the first transistor includes a first source electrically connected to the first source line, a first gate electrically connected to the first word line, and a first drain electrically connected to the second layer of the nonvolatile memory element. The second transistor includes a second source electrically connected to the second source line, second gate electrically connected to the second word line, and second drain electrically connected to the second layer of the nonvolatile memory element. In some embodiments, the first source line and the second source line are the same component of the nonvolatile memory assembly.

Provided also is a method of operating a nonvolatile memory assembly. The method may involve providing the nonvolatile memory assembly, various examples of which are described above and elsewhere in this document. The method then involves applying a first potential to the word line resulting in an electrical resistance between the drain and the source being at a first level. The method proceeds with maintaining the source line at a ground potential while applying a second potential to the bit line resulting in a first current of less than 100 microamperes flowing through the third layer and changing a resistive state of the metal oxide in the third layer of the nonvolatile memory element. The duration of this last operation may be relatively short, e.g., a few nanoseconds to a few microseconds, which is generally enough time to change the resistivity of the metal oxide. This second potential may less than about 3.0 Volts.

In some embodiments, the method proceeds with applying a predetermined potential to the word line, resulting in the electrical resistance between the drain and source being at a second level that is smaller than the first level. The method then involves maintaining the source line at the ground potential while applying a fourth potential to the bit line resulting in a second current flowing through the third layer. The second current, which may be referred to as a reading current, and is generally smaller than the first current, which may be referred to as a switching current. The second current generally does not change the resistive state of the metal oxide in the third layer of the nonvolatile memory element. The method may proceed with measuring the second current to determine the resistive state of the metal oxide. The fourth potential applied to the bit line may be less than about 1.5 Volts.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIG. 3A-1 illustrates a schematic representation of a nonvolatile memory assembly including a resistive switching memory element and transistor, in accordance with some embodiments.

FIG. 3A-2 is an electrical schematic of a circuit corresponding to the nonvolatile memory assembly illustrated in FIG. 3A-1, in accordance with some embodiments.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

Resistive random access memory (ReRAM) is a promising nonvolatile memory technology, in which the memory elements can change their resistance and be present in two or more stable states having different resistances. ReRAM is one of the leading candidates for flash replacement because of ReRAM's scalability, lower power consumption, and improved endurance. Memory elements may be organized into large memory arrays containing millions and even billions of memory elements organized on a single chip, usually according to the crossbar architecture. Such memory chips may be used for memory cards, solid state drives, and other similar devices.

Another application of the nonvolatile memory technology includes embedding one or more memory elements into integrated circuits containing other non-memory components, such as logic, digital signal processing, analog, and other similar components. These logic components typically use low voltages for their operations (e.g., less than 10 Volts). These voltages are often substantially lower than voltages used by NOR flash memory elements. As such, logic transistors and flash memory have divergent requirements, with the former requiring low voltages for its operation whereas the latter type of memory requiring very high voltages for its operation. This voltage difference makes it particularly difficult to embed flash memory elements into integrated circuits. Specifically, a number of masks and processing steps needed to create logic and flash memory on the same chip is significant resulting in high complexity and costs of resulting devices. It is worth noting that memory arrays described above do not have this voltage difference issue as entire memory chips are designed to operate at voltages suitable for its memory elements.

ReRAM is a good candidate for embedded memory applications, as it can be easily integrated into a logic process flow for various reasons. Its integration may be performed with as little as two additional masks in the overall chip fabrication process flow as further illustrated below with reference to FIGS. 4 and 5A-5E. In contrast, a typical NOR flash integration may use as many as ten additional masks. Furthermore, ReRAM fabrication can be performed at relatively low temperatures making it possible to integrate into the backend. In some embodiments, the processing temperatures do not exceed 500° C., while some flash fabrication processes may require temperatures as high as 1000° C. and above. Additionally, switching voltages and currents used for operating ReRAM elements are relatively low compared to flash thereby alleviating a need for periphery high voltage CMOS transistors. Such CMOS transistors are necessary for operation of flash memory and may complicate circuit designs and restrict scalability. For example, ReRAM elements may be configured to switch at voltages less than 5 Volts, while flash elements need at least 10 Volts.

An electrical current steering element may be combined with a ReRAM element to ensure a sufficient operating control, particularly when multiple memory elements are provided on same bit line. Both unipolar and bipolar switching type ReRAM elements may be used. ReRAM elements having unipolar switching characteristics may be coupled to a single current steering element, such as a MOSFET. One having ordinary skills in the art would understand polarity requirement driven by different types of steering elements. ReRAM elements having bipolar switching characteristics may be coupled to one or two current steering elements, such as MOSFETS. Other steering elements include polysilicon diode, bipolar junction transistor based on metal oxide diodes, and ovonic threshold switch.

Provided are nonvolatile memory assemblies each including a resistive switching layer and transistor or some other current steering element. The transistor is connected in series with the switching layer and is used for controlling the resistance of the overall assembly. This resistance control allows employing specific switching layers that use low voltages during forming and switching operations. The resulting resistive switching assemblies are more easily embeddable into integrated circuit chips having logic, digital signal processing, analog, and other types of low voltage components as discussed above. In some embodiments, switching operations are performed at less than about 3.0V and resulting in currents of less than 150 microamperes. Overall, these nonvolatile memory assemblies provide ease of integration, use fabrication friendly materials and processes (e.g., low temperatures), and operate at low switching voltages and currents while still meeting the reliability requirements for memory components, such as data retention and endurance.

The nonvolatile memory element of the assembly includes two electrodes and a resistive switching layer provided between the two electrodes. Other components, such diffusion barrier layers and hard masks, may be also incorporated into the memory element as well. The resistive switching layer may include hafnium oxide or other suitable material. For example, metal rich metal oxides may be used. In some examples, hafnium oxide used for the resistive switching layer has a stoichiometric formula of $HfO_x$ with X being between about 1.7 and 1.9. This deviation from the stoichiometric oxide (e.g., $HfO_2$) indicates a concentration of oxygen vacancies in the resistive switching layer that allows this layer to switch between two or more resistance states depending on arrangement of these oxygen vacancies within the layer as well as depending on exchange of these vacancies with one or both electrodes.

One electrode may be made of titanium nitride or other suitable material that is capable of absorbing oxygen from the resistive switching layer and supplying oxygen to this layer during resistive switching operations. This electrode may be referred to as a reactive electrode. Without being restricted to any particular theory, it is believed that the concentration of oxygen vacancies in the resistive switching layer is responsible, at least in part, for changing the resistance in this layer. A material for this electrode should be stable, especially with respect to air exposure and thermal processing, and should generally not release any components (e.g., metal ions) other than oxygen into the resistive switching layer.

Another electrode may include a sufficiently inert material and generally may not exchange oxygen with the resistive switching layer, at least during operation of the memory assembly. This electrode may be made, for example, from polysilicon or, more specifically, from n-doped polysilicon. Polysilicon may form a thin passivation layer of silicon oxide at the interface with the resistive switching layer.

Materials and corresponding structures used for both electrodes and resistive switching layer of the memory element are specifically selected to achieve low power switching characteristics of the memory element. It should be noted that electrodes and resistive switching layers having only similar composition may not necessarily perform at these power levels. For example, thicknesses of layers, their morphologies, specific processing operations, and other factors may have substantial impact on resistive switching characteristics. Furthermore, coupling a specifically configured ReRAM element with a controllable current steering element, such as a MOSFET, allows achieving new performance synergies. For example, different resistance levels may be provided by the current steering element during read and switching operations to use lower power and to create more discrete operating regimes.

Examples of Nonvolatile Memory Elements and their Switching Mechanisms

A brief description of nonvolatile memory elements, such as nonvolatile memory elements, and their switching mechanisms are provided for better understanding of various features and structures associated with low power switching further described in this document. A resistive switching nonvolatile memory includes a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

Figure 1A:
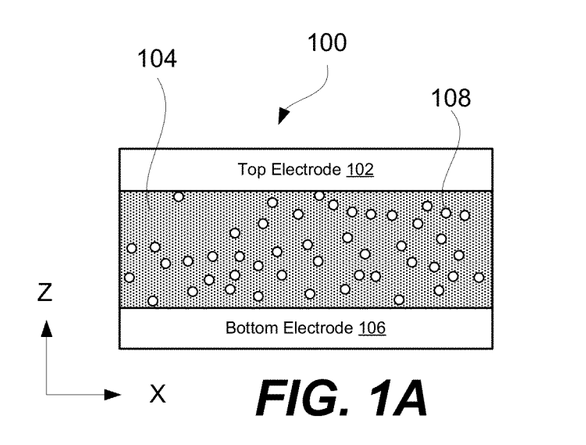
FIGS. 1A and 1B illustrate schematic representations of a nonvolatile memory element in its high resistive state (HRS) and low resistive state (LRS), in accordance with some embodiments.

A basic building unit of a memory device is a stack having a capacitor like structure. A nonvolatile memory element includes two electrodes and a dielectric positioned in between these two electrodes. FIG. 1A illustrates a schematic representation of nonvolatile memory element 100 including top electrode 102, bottom electrode 106, and resistive switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second form" electrodes or simply "first" and "second", are used identify the two electrodes. Nonvolatile memory element 100 may also include other components, such as an embedded resistor, diode, and other components. Nonvolatile memory element 100 is sometimes referred to as a memory element or a memory unit.

As discussed above, resistive switching layer 104, which may be made of dielectric material, can be made to conduct through one or more filaments or conduction paths formed by applying a certain voltage. To provide this resistive switching functionality, resistive switching layer 104 includes a certain concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electronic conductivity. In this example, the polarity of the pulse used to perform this change determines the direction of the change, i.e., reduction or oxidation. Other resistive switching mechanisms include bipolar electrochemical metallization mechanism and thermochemical mechanism, which leads to a change of the stoichiometry due to a current-induced increase of the temperature.

Figure 1B:
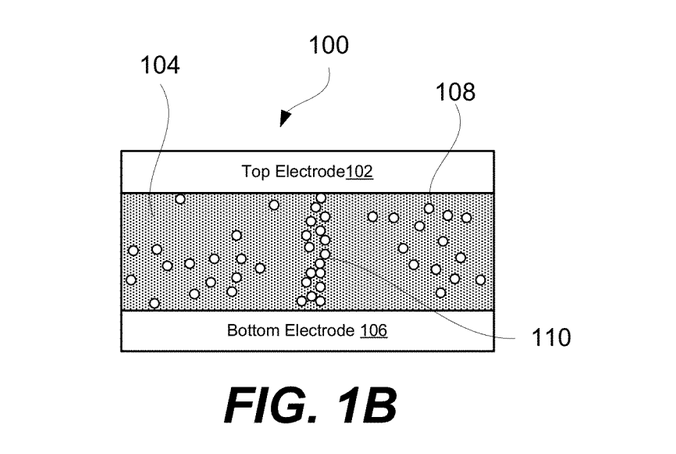

Without being restricted to any particular theory, it is believed that defects 108 can be reoriented within resistive switching layer 104 to form filaments or conduction paths as, for example, schematically shown in FIG. 1B as element 110. This reorientation of defects 108 occurs when a voltage for this type of resistive switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistive switching layer 104 during or after its fabrication. For example, a certain concentration of oxygen deficiencies can be introduced into metal oxides during their deposition or during subsequent annealing. Physical vapor deposition (PVD) and atomic layer deposition (ALD) techniques may be specifically tuned to include particular defects 108 and their distribution within resistive switching layer 104. Doping and other techniques could be also used to create defects 108 in resistive switching layer 104.

Figure 2A:
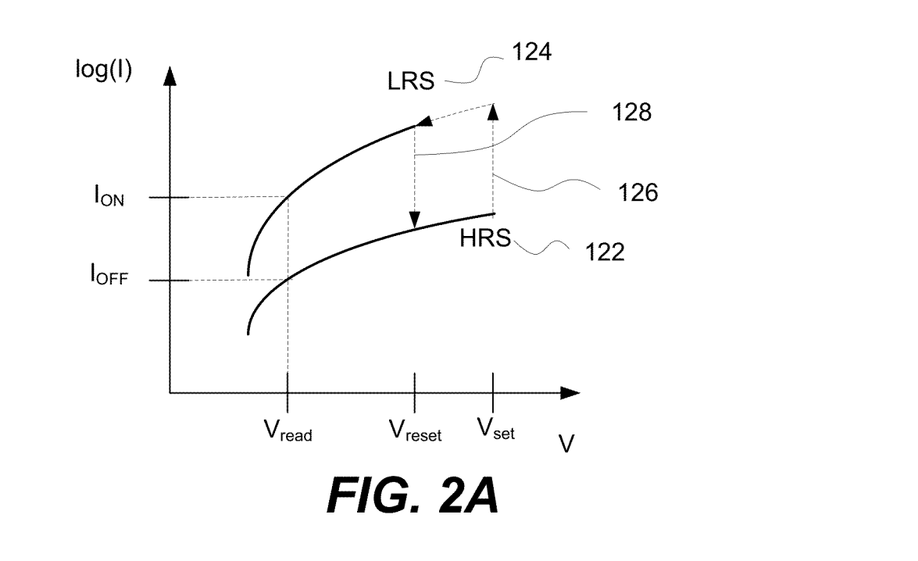
FIG. 2A illustrates a plot of a current passing through a unipolar ReRAM cell as a function of a voltage applied to the ReRAM cell, in accordance with some embodiments.
Figure 2B:
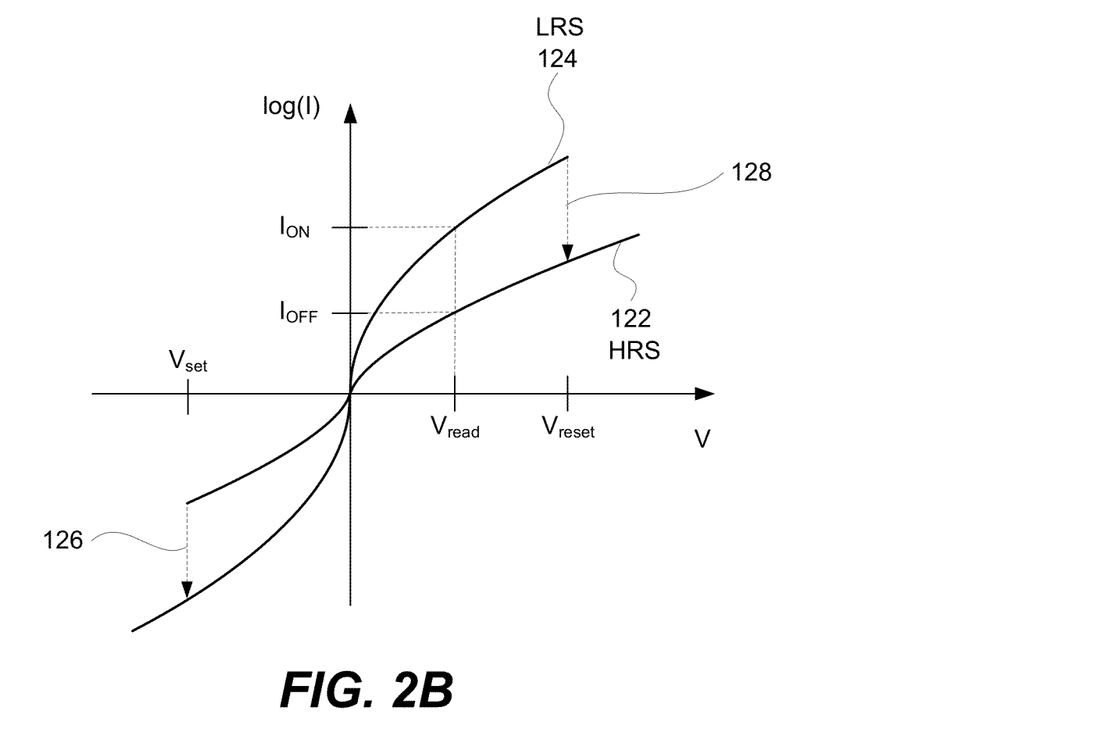
FIG. 2B illustrates a plot of a current passing through a bipolar ReRAM cell as a function of a voltage applied to the ReRAM cell, in accordance with some embodiments.

Operation of ReRAM cell 100 will now be briefly described with reference to FIGS. 2A and 2B illustrating logarithmic plots of a current through a ReRAM cell as a function of a voltage applied to the electrode of the ReRAM cell, in accordance with some embodiments. Specifically, FIG. 2A represent unipolar switching of a ReRAM cell, while FIG. 2B represents a bipolar switching.

ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell may be used to store one bit of data. It should be noted that some ReRAM cells may have three and even more resistive states allowing multiple bit storage in the same stack. One having ordinary skills in the art would understand application of this example to more complex ReRAM cell architectures.

HRS and LRS are defined by presence or absence of one or more filaments or conduction paths in a resistive switching layer a ReRAM cell. For example, a ReRAM cell may be initially fabricated in LRS (after depositing all layers and forming the resistive switching layer) and then switched to HRS. In some embodiments, the initial deposited stack including both electrodes and a resistive switching layer is in HRS and forming operation is then used to bring it into the initial LRS. The ReRAM cell may be switched back and forth between LRS and HRS many times, defined by set and reset cycles. Furthermore, the ReRAM cell may maintain its LRS or HRS for a substantial period of time and withstand a number of read cycles.

The overall operation of a ReRAM cell may be divided into a read operation, set operation, and reset operation. During the read operation, the state of the ReRAM cell or, more specifically, the resistance of its resistive switching layer can be sensed by applying a sensing voltage to its electrodes. The sensing voltage is sometimes referred to as a "read" voltage and indicated as $V_{READ}$ in FIG. 2A. If the ReRAM cell is in its HRS at the time of reading (as represented by line 122), then the external read and write circuitry connected to electrodes 102 and 106 will sense the resulting "off" current ($I_{OFF}$) that flows through ReRAM cell 100. As stated above, this read operation may be performed multiple times without switching ReRAM cell 100 between HRS and LRS. In the above example, the ReRAM cell 100 should continue to output the "off" current ($I_{OFF}$) when the read voltage ($V_{READ}$) is applied to the electrodes.

Continuing with the above example, when it is desired to switch ReRAM cell 100 into a different logic state, ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by dashed line 126. In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without toggling ReRAM cell 100 between HRS and LRS. ReRAM cell 100 being in LRS, ReRAM cell 100 should continue to output the "OFF" current ($I_{OFF}$) when the read voltage ($V_{READ}$) is applied to the electrodes.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to resistive switching layer 104 to break the previously formed filaments or conduction paths in resistive switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistive switching layer 104. As such, unipolar ReRAM cells may be read and switched in accordance with the plot illustrated in FIG. 2A or the plot illustrated in FIG. 2B. The bipolar switching requires the set voltage ($V_{SET}$) and reset voltage ($V_{RESET}$) to have different polarities. As such, bipolar ReRAM cells may be read and switched in accordance with the plot illustrated in FIG. 2B (but not in accordance with the plot illustrated in FIG. 2A).

In some embodiments, the write voltage ($V_{WRITE}$) is between about 100 mV and 10V or, more specifically, between about 500 mV and 5V. The length of write voltage pulses ($t_{WRITE}$) may be less than about 100 microseconds or, more specifically, less than about 5 microseconds and even less than about 100 nanoseconds. The read voltage ($V_{READ}$) may be between about 0.1 and 0.5 of the write voltage ($V_{WRITE}$). In some embodiments, the current during reading operations may be between about 0.1 micro Amps and about 100 micro Amps depending on the state of the ReRAM cell (i.e., LRS or HRS) and operating regimes. For example, a ReRAM cell may be subjected to low current operating conditions, in which LRS corresponds to currents less than about 0.2 micro Amps and HRS corresponds to currents greater than about 2 micro Amps. The cell may be also subjected to high current operating conditions, in which LRS corresponds to currents less than about 0.5 micro Amps and HRS corresponds to currents greater than about 50 micro Amps. The low current conditions require less power but have a smaller ratio of the two thresholds (i.e., 10× in the above examples). Furthermore, the data retention of such cells is typically substantially lower (e.g., commonly tested by subjecting cells to elevated temperature conditioning). The low current conditions may be used for NAND-replacement applications, e.g., memory arrays, while the high current conditions are typically used for embedded applications. The length of read voltage pulse ($t_{READ}$) may be comparable to the length of the corresponding write voltage pulse ($t_{WRITE}$) or may be shorter than the write voltage pulse ($t_{WRITE}$).

In some embodiments, a set voltage ($V_{SET}$) and reset voltage ($V_{RESET}$) dependent on the thickness of resistive switching layer 104. Without being restricted to any particular theory it is believed that this behavior is indicative of a bulk-mediated switching mechanism. Generally, the bulk-mediated switching mechanism forms percolation paths through the bulk of resistive switching layer 104. Materials exhibiting this behavior include higher bandgap metal oxides (i.e., oxides with a bandgap greater than 4 eV), such as hafnium oxide, aluminum oxide, tantalum oxide, zirconium oxide, and yttrium oxide. It should be noted that these oxides includes specifically formed defects and therefore are distinguishable from typical oxides of these metals, e.g., stoichiometric oxides containing no impurities. As such, it is possible to reduce required voltages by scaling down the thickness of resistive switching layer 104. Other materials, such as titanium oxide and niobium oxide, require substantially the same set and reset voltages over a wide span of their thicknesses.

Nonvolatile Memory Assembly Examples

Figure 3A:
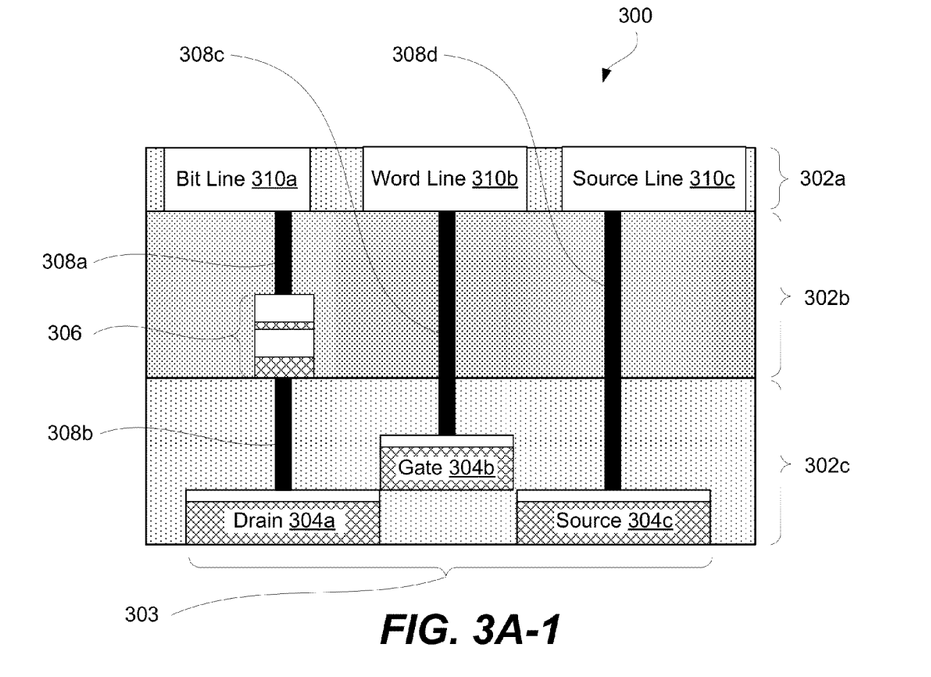

FIG. 3A-1 illustrates a schematic representation of nonvolatile memory assembly 300 including resistive switching memory element 306 and transistor 303, in accordance with some embodiments. A set of signal lines including bit line 310a, word line 310b, and source line 310c is used for operating resistive switching memory element 306 and field effect transistor 303. Specifically, one electrode of resistive switching memory element 306 is connected to bit line 310a, while another electrode is connected to drain 304a of transistor 303. Gate 304b of transistor 303 is connected to word line 310b, while source 304c is connected to source line 310c. Other embodiments may include a resistive switching memory connected to a source of transistor, while its drain is directly connected to one of the signal lines.

These electrical connections may be provided by contacts 308a-308d that protrude through one or more dielectric layers or portions thereof (e.g., layers 302b and 302c). Contacts 308a-308d may be made from tungsten or other suitable conductive materials. A contact is formed by opening a contact hole in one or more corresponding dielectric layers and filling the contact hole with the conductive material.

Figure 3A:
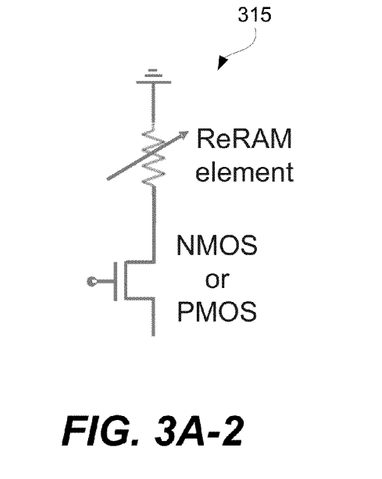

Different components of assembly 300 may be disposed within different interlayer dielectric (ILD) layers 302a-302c. For example, all signal lines 310a-310c may be formed within the same ILD layer 302a. This arrangement is different from typically crossbar architectures used for memory chips, in which word and bit lines are disposed in different ILD layers, i.e., on different sides of memory elements. Resistive switching memory element 306 may be provided in middle ILD layer 302b, which may be between about 200 nanometers and 1000 nanometers thick, e.g., around 500 nanometers. Transistor 303 may be provided in yet another ILD layer 302c, which may also be between about 200 nanometers and 1000 nanometers thick, e.g., around 500 nanometers. FIG. 3A-2 is an electrical schematic of circuit 315 corresponding to the nonvolatile memory assembly illustrated in FIG. 3A-2, in accordance with some embodiments. The transistor connected to the ReRAM element may be a PMOS or an NMOS transistor. Furthermore, either drain or source may be connected to the electrode of the ReRAM cell.

Figure 3B:
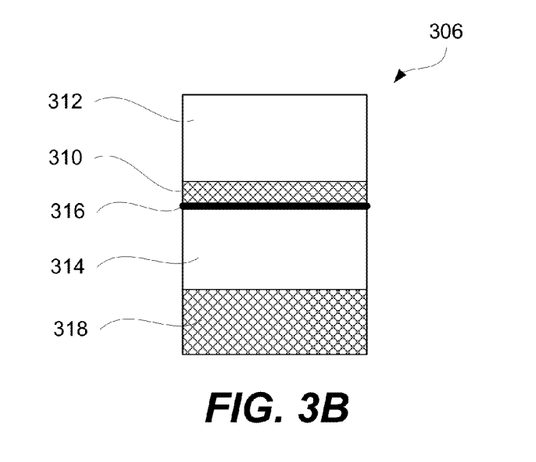
FIG. 3B illustrates a more detailed schematic representation of the resistive switching memory element in FIG. 3A-1, in accordance with some embodiments.

FIG. 3B illustrates a more detailed schematic representation of resistive switching memory element 306, in accordance with some embodiments. Resistive switching memory element 306 includes two electrodes 312 and 314 and resistive switching layer 310 provided between two electrodes 312 and 314. Other layers, such as diffusion barrier layer 318 may be positioned at the interface of one electrode and contact. Furthermore, a layer may form a specific interface or, more specifically, sub-layers with an adjacent layer. For example, electrode 314 is shown to have sub-layer 316 with resistive switching layer 310. Each of these layers and interfaces may be specifically configured as further explained below to achieve low power switching characteristics of resistive switching memory element 306. Furthermore, transistor 303 and other components of assembly 300 provide support and control to make these low power switching characteristics operable.

Resistive switching layer 310 may be formed from hafnium oxide or some other suitable materials. Metal rich oxides may be used. For example, hafnium oxide in resistive switching layer 310 may have a stoichiometric formula of HfOx with X being between about 1.7 and 1.9 or, more specifically, between about 1.75 and 1.85, e.g., about 1.8. In general, an atomic concentration of oxygen vacancies in metal oxides used for resistive switching layer 310 may be at least about 1% or, more specifically, at least about 5% and even at least about 10%. A certain level of defects (e.g., a concentration of oxygen vacancies) in a resistive switching level can be controlled during its formation (e.g., controlling oxidation conditions) or during post-deposition treatments (e.g., annealing a stack containing a stoichiometric oxide and oxygen getter layer).

Hafnium oxide generally requires lower switching currents than large bandgap oxides, such as aluminum oxide. Furthermore, metal rich hafnium oxide generally requires less power to switch. Use of metal rich oxides has been somewhat restricted in the past because a minimal resistance is needed through the resistive switching layer at some operating regimes. However, adding a steering element with a controllable resistance in series with a switching layer generally addresses some of these concerns. Furthermore, data indicate that a metal rich hafnium oxide layer having a thickness of 50 Angstroms generally performed slightly more favorably than thinner layers having similar composition. Overall, data indicate that layers having a thickness of between about 15 Angstroms and 110 Angstroms or, more specifically, between about 20 Angstroms and 60 Angstroms, such as about 50 Angstroms could be used for low power and high reliability applications.

At least one electrode in resistive switching layer 310 is a reactive electrode. The other electrode may be reactive or inert. The following description refers to electrode 312 being a reactive electrode and electrode 314 being an inert electrode. However, spatial orientations of the two types of electrodes relative to other components of the assembly may be changed and an inert electrode may be connected to a signal line, while a reactive electrode may be connected to a current steering element. In some embodiments, both electrodes may be reactive electrodes. However, resistive memory elements having one inert electrode generally perform better than resistive switching memory elements in which both electrodes are reactive.

Reactive electrode 312 may include titanium nitride or other suitable materials. Reactive electrode 312 is configured to absorb and release defects (e.g., oxygen) from resistive switching layer 310. Materials used should be sufficiently stable during thermal processing and prevent the release of any components (other than the ones associated with defects) to resistive switching layer 310.

Reactive electrode 312 may have a thickness of between about 100 Angstroms and 2000 Angstroms or, more specifically, between about 600 Angstroms and 1,500 Angstroms, e.g., 1,000 Angstroms. In general, thicknesses of electrodes may be less critical than the thickness of a resistive switching layer to achieve low power operating characteristics.

Inert electrode 314 may include polysilicon, such as n-doped polysilicon. In some embodiments, the concentration of dopants may be between about $10^{18}$ and $10^{21}$ atoms per centimeter cubed or, more specifically, between about $10^{19}$ and $10^{20}$ atoms per centimeter cubed. A higher than typical dopant concentration may be used to minimize dopant depletion in electrode 314 and to maintain adequate conductivity levels. Some examples of n-dopants include phosphorus (P), arsenic (As), antimony (Sb), and bismuth (Bi).

A work function of n-doped polysilicon is lower than that of p-doped polysilicon. As such, the barrier height when coupled with hafnium oxide and other like oxides is generally lower for n-doped polysilicon, which results in a lower forming voltage of the resistive switching layer. In a similar manner, lower set voltages were observed for n-doped polysilicon in comparison to p-doped polysilicon.

Inert electrode 314 may have a thickness of between about 100 Angstroms and 1000 Angstroms or, more specifically, between about 300 Angstroms and 800 Angstroms, e.g., 500 Angstroms.

In some embodiments, inert electrode 314 forms passivation layer 316 at the interface with resistive switching layer 310. Passivation layer 316 may be formed during formation of inert layer 314 and/or resistive switching layer 310 or later operations (e.g., annealing). In the example of inert electrode 314 containing polysilicon, passivation layer 316 may be formed by converting a small portion of polysilicon into silicon oxide. Oxygen may be provided from the environment (e.g., prior to formation of resistive switching layer 310) and/or from resistive switching layer 310 (e.g., during its formation or after its formation). Sometimes, passivation layer 316 is referred to as an interfacial oxide and may include oxygen and oxygen vacancies. However, generally no oxygen transfer occurs between passivation layer 316 and resistive switching layer 310 during switching operations (unlike the example with reacting electrode 312 described above). Furthermore, passivation layer 316 may be sufficiently thin and may also contain dopant to provide adequate conductivity through inert electrode 314.

In some embodiments, resistive switching memory element 306 also includes diffusion barrier layer 318, which may be made from materials such titanium nitride, tantalum nitride, and the like. Diffusion barrier layer 318 may have a thickness of between about 100 Angstroms and 1,000 Angstroms or, more specifically, between about 300 Angstroms and 800 Angstroms, e.g., 500 Angstroms. The overall thickness of resistive switching memory element 306 may be between about 250 Angstroms and 3,000 Angstroms, e.g., 2,000 Angstroms.

Bipolar and Unipolar Switching Examples

Provided nonvolatile memory assemblies may include resistive switching layers that have bipolar or unipolar switching characteristics. As discussed above, the unipolar switching does not depend on the polarity of the set voltage ($V_{SET}$) and reset voltage ($V_{RESET}$) applied to the resistive switching layer. In the bipolar switching the set voltage ($V_{SET}$) and reset voltage ($V_{RESET}$) applied to the resistive switching layer need to have different polarities. An example of nonvolatile memory assemblies discussed above with reference with FIG. 3A-1, may be used for unipolar or bipolar switching.

As described above, the overall operation of a ReRAM cell may be divided into reading, setting the cell (by switching the cell from its HRS to its LRS), and resetting the cell (by switching the cell from its LRS to its HRS). Different voltages are applied to a bit line, a word line, and a source lines during these operation. One example of such voltages is presented in the table below to provide better understanding of the overall operation.

TABLE

|  | Source Line Voltage (Source) | Bit Line Voltage (Drain) | Word Line Voltage (Gate) |
| --- | --- | --- | --- |
| Set | ~2 V | 0 V | ~2-5 V |
| Reset | 0 V | ~-2 V | ~2-5 V |
| Read | ~0.5-1 V | 0 V | ~2 V |

One having ordinary skills in the art would understand that these values are illustrative only and depend on various design considerations, such as materials used for electrodes and resistive switching layers, thicknesses and methods of fabrication of resistive switching layers, and the like. Furthermore, the above example is provided for bipolar switching.

Figure 3C:
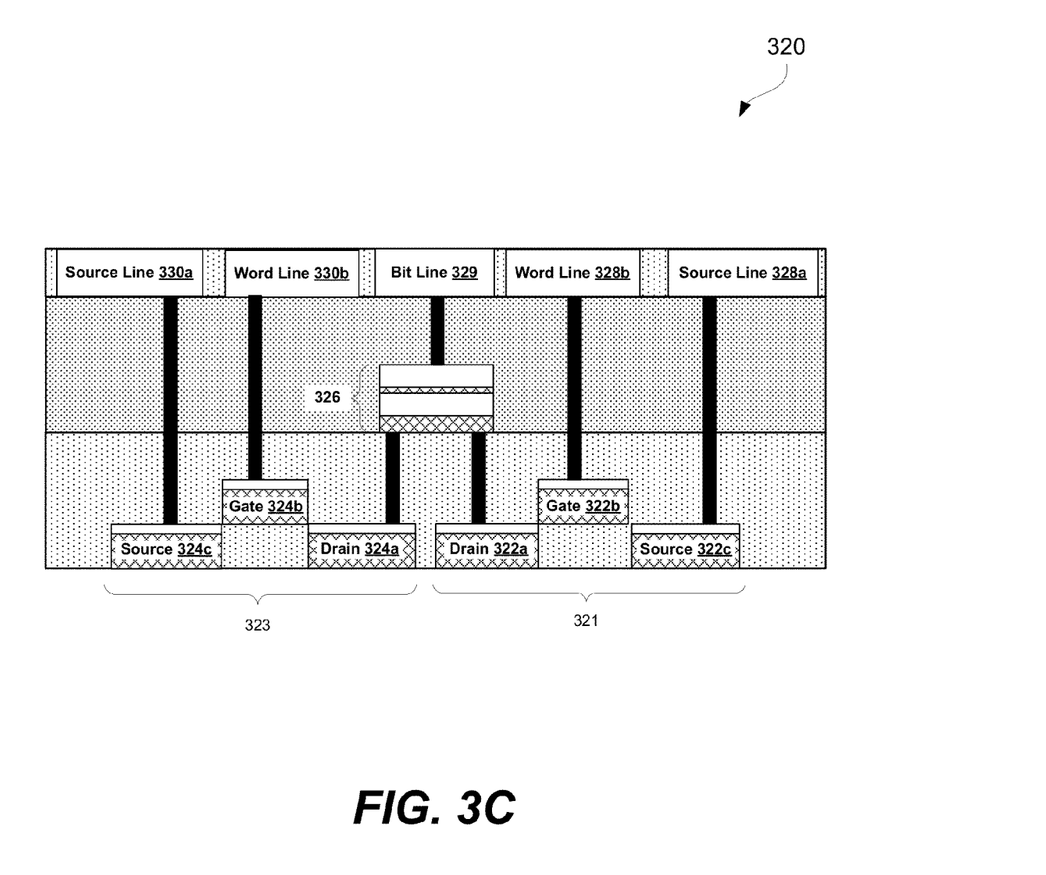
FIG. 3C illustrates a schematic representation of a nonvolatile memory assembly including a resistive switching memory element and two transistors used for bipolar switching of the memory element, in accordance with some embodiments.

FIG. 3C illustrates a schematic representation of nonvolatile memory assembly 320 including resistive switching memory element 326 and two transistors 321 and 323 used for bipolar switching memory element 326, in accordance with some embodiments. A set of signal lines includes bit line 329 connected to one electrode of memory element 326. The other electrode of memory element 326 may be connected to drain 322a of first transistor 321 (i.e., the first drain) and drain 324a of second transistor 323 (i.e., the second drain). Other signal lines include first word line 328b connected to gate 322b of first transistor 321 (i.e., the first gate), second word line 330b connected to gate 324b of second transistor 323 (i.e., the second gate), first source line 328a connected to source 322c of first transistor 321 (i.e., the first source), and second source line 330a connected to source 324c of second transistor 323 (i.e., the second source). In some embodiments, some signal lines may be combined. For example first source line 328a and second source line 330a may be combined by connecting first source 322c and second source 324c to the same signal line.

Figure 3D:
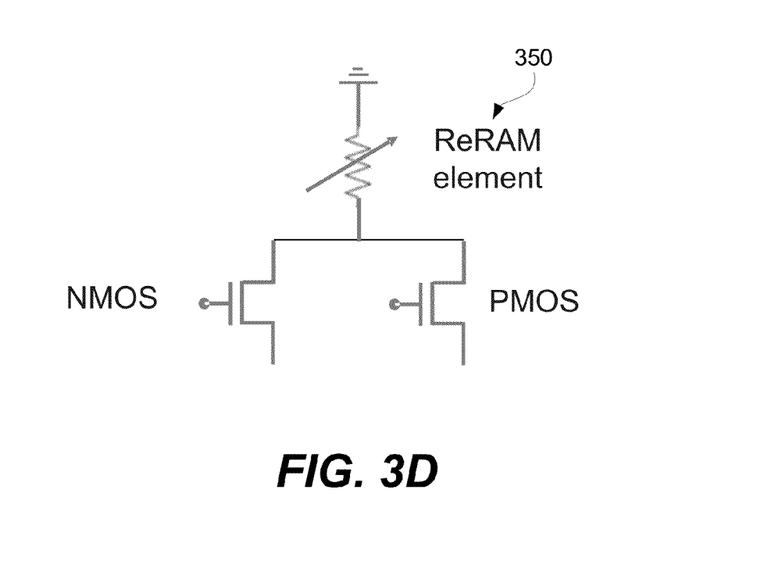
FIG. 3D is an electrical schematic of a circuit corresponding to the nonvolatile memory assembly illustrated in FIG. 3C, in accordance with some embodiments.

Memory element 326 may be similar to memory element examples described above with reference to FIG. 3B. FIG. 3D is an electrical schematic of circuit 350 corresponding to the nonvolatile memory assembly illustrated in FIG. 3C, in accordance with some embodiments. As stated above, either drain regions or source regions of the transistors may be connected to ReRAM elements. Operation of nonvolatile memory assembly 320 will be understood by one having ordinary skills in the art.

Processing Examples

Figure 4:
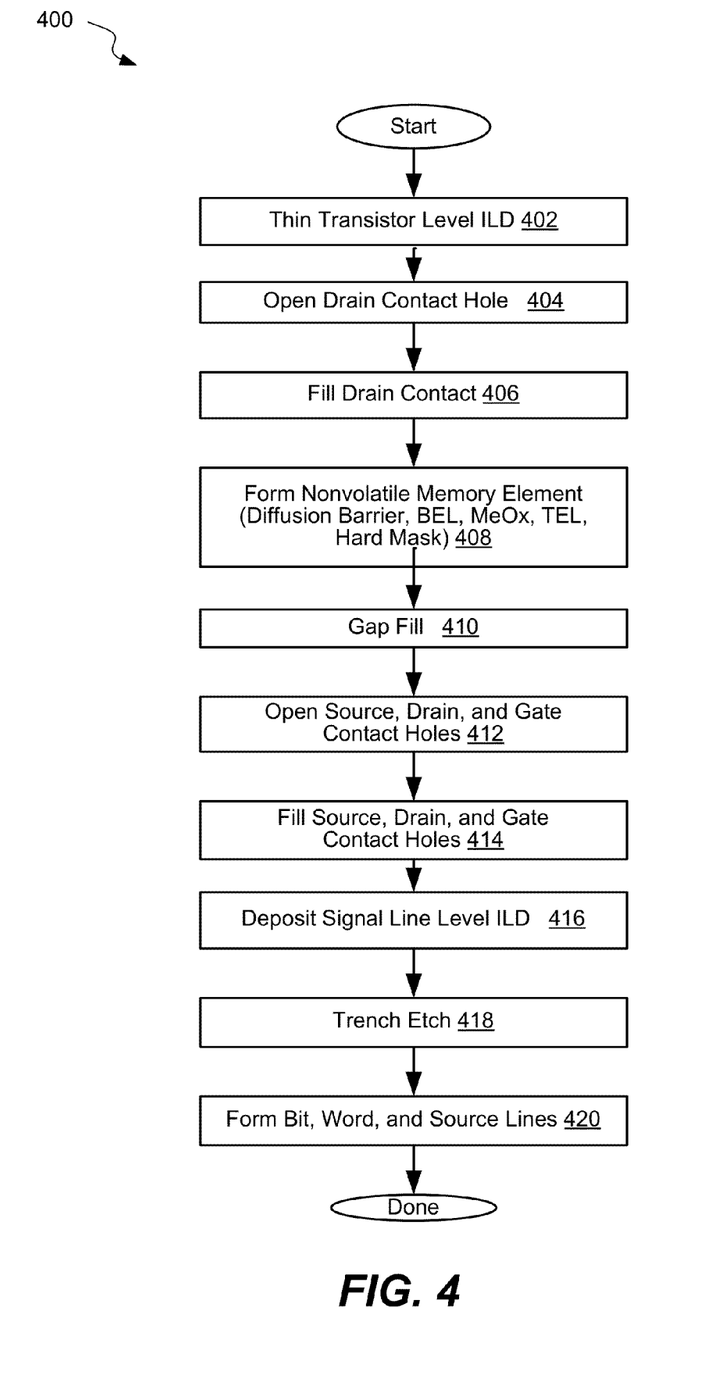
FIG. 4 is a process flowchart corresponding to a method of forming a nonvolatile memory assembly including a resistive switching memory element and transistor, in accordance with some embodiment.

FIG. 4 is a process flowchart corresponding to method 400 of forming a nonvolatile memory assembly including a resistive switching memory element and transistor, in accordance with some embodiments. Examples of such a nonvolatile memory assembly are described above. Method 400 is described to illustrate that fewer masks and processing operations are needed for form nonvolatile memory assemblies including resistive switching memory elements than to form flash memory assemblies.

Method 400 may start with providing a partially manufactured semiconductor device (e.g., a wafer) having transistors provided in an ILD layer. This ILD transistor level layer may be thinned down during operation 402 to provide a predetermined distance between a surface used to form a resistive switching element and drain or source of the transistor. In some embodiments, this distance is between about 200 nanometers and 1000 nanometers, e.g., 500 nanometers.

Method 400 may proceed with opening a drain contact hole during operation 404. This contact hole will be used to form an electrical connection between the drain of the transistor and resistive switching element or, more specifically, with its bottom electrode (which may be inert or reactive electrode). Specifically, the thinned ILD layer may be patterned and etched to open the drain contact hole. Multiple openings over the entire substrate can be patterned at once. A photolithography process, in which photoresist is deposited over the surface, patterned (e.g., exposure through a mask), and developed, may be used. The exposed portions of the dielectric are then dry or wet etched to remove the dielectric. It should be noted that only one contact hole to each transistor may be opened during this operation, e.g., a drain contact hole but not gate and source contact holes. As discussed above, in some embodiments, a resistive switching element may be connected to a source of the transistor in which case, the source contact hole is opened during this operation (and not the drain contact hole). This process and design variation will be readily understood by one having ordinary skills in the art.

Figure 5A:
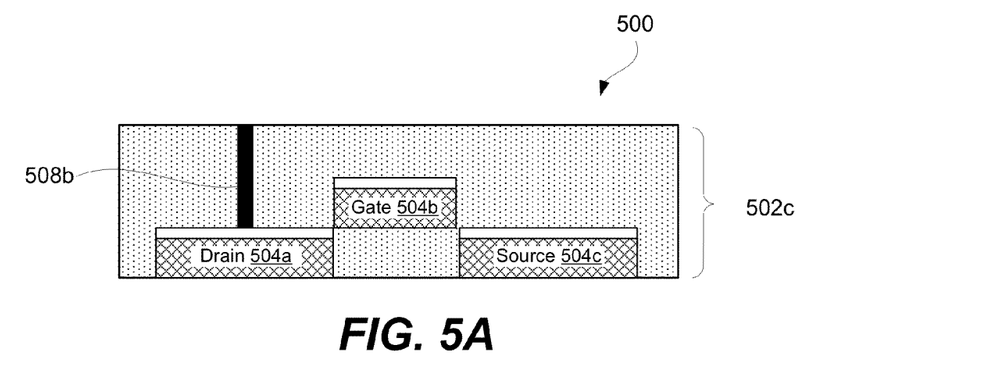
FIGS. 5A-E illustrate schematic representations of a nonvolatile memory assembly during various stages of its fabrication, in accordance with some resistance switching embodiment.

Method 400 may proceed with filing the drain contact hole during operation 406. Tungsten, titanium, their nitrides, or other suitable material may be used for this purpose and may function as a barrier layer. Tungsten fill may be accomplished by CVD of halogen-based tungsten precursor (e.g., $WF_6$). After forming the tungsten contact, subsequent processing operations are performed, e.g., chemical mechanical planarization. FIG. 5A illustrates partially manufactured nonvolatile memory assembly 500 at this stage in the fabrication process, in accordance with some embodiments. Specifically, assembly 500 includes ILD layer 502c containing drain 504a, gate 504b, and source 504c and contact 508b in electrical communication with drain 504a.

Returning to FIG. 4, method 400 may proceed with forming a nonvolatile memory element during operation 408. As discussed above, the first (bottom) layer in the memory element may be a titanium nitride barrier layer, which may be formed using PVD or other suitable deposition techniques. Deposition of the titanium nitride layer may be performed using a titanium sputtering target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as atomic layer deposition (ALD), pulsed laser deposition (PLD), and chemical vapor deposition (CVD), evaporation, and the like can also be used to deposit this layer.

The next layer may include polysilicon or, more specifically, doped polysilicon. This layer may be formed using a CVD technique by providing a silicon containing precursor (e.g., silane) and dopant containing precursor (e.g., phosphine) into a processing chamber and reacting these precursors at a temperature of 500-600° C. Other techniques may be used as well. Flow rates and concentrations of the silicon containing precursor and dopant containing precursor may be maintained to achieve a desired dopant concentration in the polysilicon electrode. A passivation silicon oxide layer on the polysilicon electrode may be formed prior to deposition of the resistive switching layer, for example, by exposing the polysilicon electrode to an oxygen containing environment. Alternatively, silicon oxide may be formed by diffusion of oxygen from the resistive switching layer. The last approach also creates oxygen vacancies in the resistive switching layer and may be used to control concentration and distribution of these oxygen vacancies in the resistive switching layer.

Operation 408 may then involve forming a resistive switching layer. For example, a hafnium oxide layer may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride (HfCl$_4$), and a suitable oxidant, such as water, oxygen plasma, or ozone. The oxygen concentration in hafnium oxide or some other suitable metal oxide may be controlled by adjusting the oxygen concentration in the sputtering environment when PVD is used or by controlling saturation levels during ALD processing.

Figure 5B:
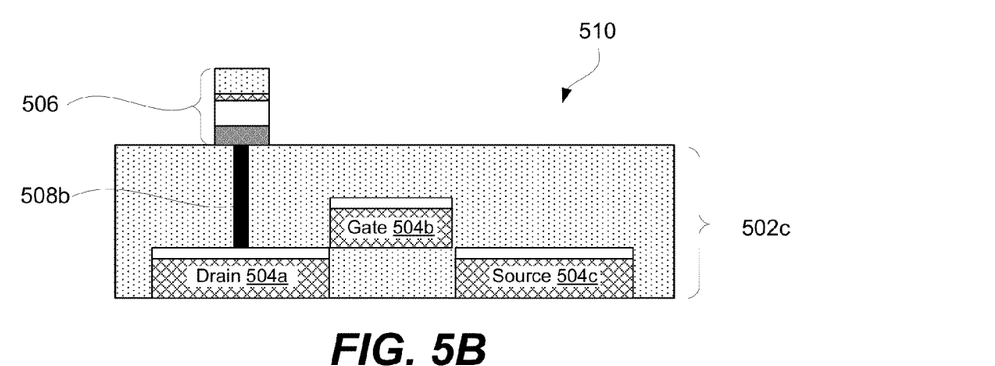

The top electrode including titanium nitride may be then deposited over the resistive switching layer. Deposition of this electrode may be performed in a manner similar to deposition of the titanium nitride diffusion barrier layer described above. FIG. 5B illustrates partially manufactured nonvolatile memory assembly 520 at this stage in the fabrication process, in accordance with some embodiments. Specifically, this assembly 510 includes resistance memory element 506 provided over ILD layer 502c and connected to drain 504a by contact 508b. In some embodiments, nonvolatile memory assembly 520 also include silicon nitride mask deposited over the top electrode (not shown).

Figure 5C:
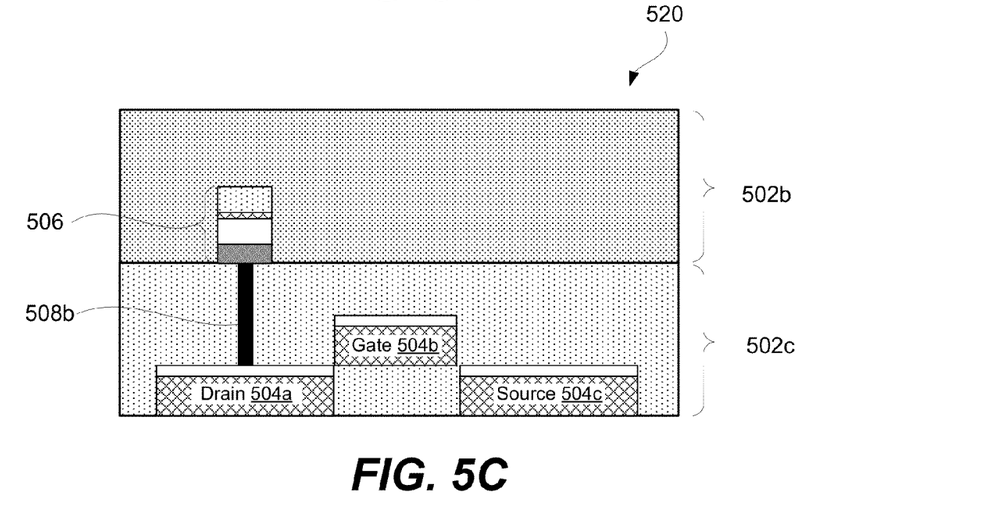

Returning to FIG. 4, method 400 may proceed with operation 410, which involves gap fill and, as a result, forming another ILD layer. CVD may be used for this purpose by supplying ozone and TEOS (tetraethoxysilane) in a processing chamber. Specific variations of CVD suitable for gap fill include high density plasma chemical vapor deposition (HD-PCVD), atmospheric pressure chemical vapor deposition (APCVD), subatmospheric chemical vapor deposition (SACVD), and plasma enhanced chemical vapor deposition (PECVD). An example of the partially manufactured nonvolatile memory assembly after this operation is illustrated in FIG. 5C.

Figure 5D:
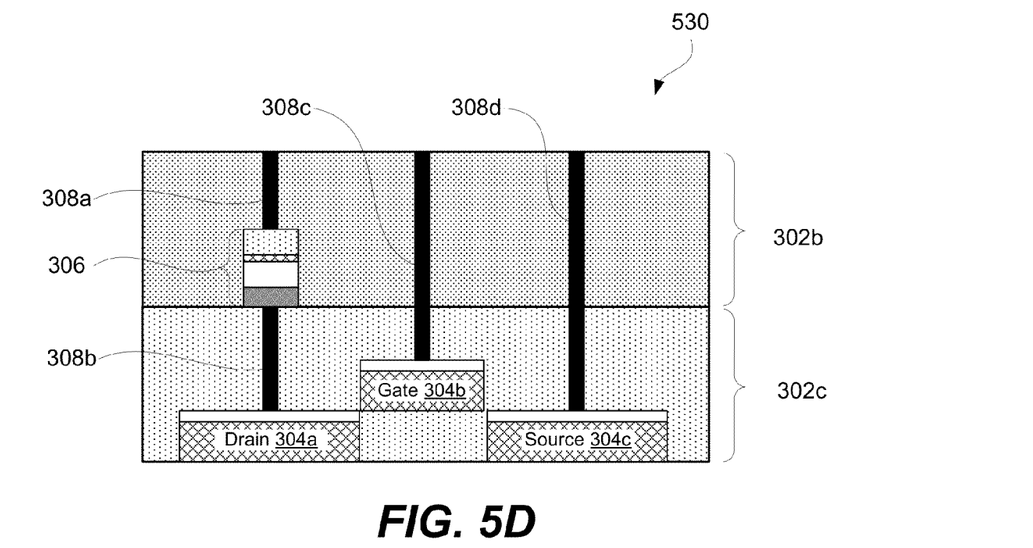

Method 400 may proceed with opening source, drain, and gate contact holes during operation 412, which may be performed in a manner similar to operation 404 described above. It should be noted that the drain contact hole opened during operation 412 extends to the resistance memory element 506 in the second ILD layer, while the source and gate contact holed extend to the source and gates of the transistor in the bottom IL layer. An example of the partially manufactured nonvolatile memory assembly after this operation is illustrated in FIG. 5D.

Figure 5E:
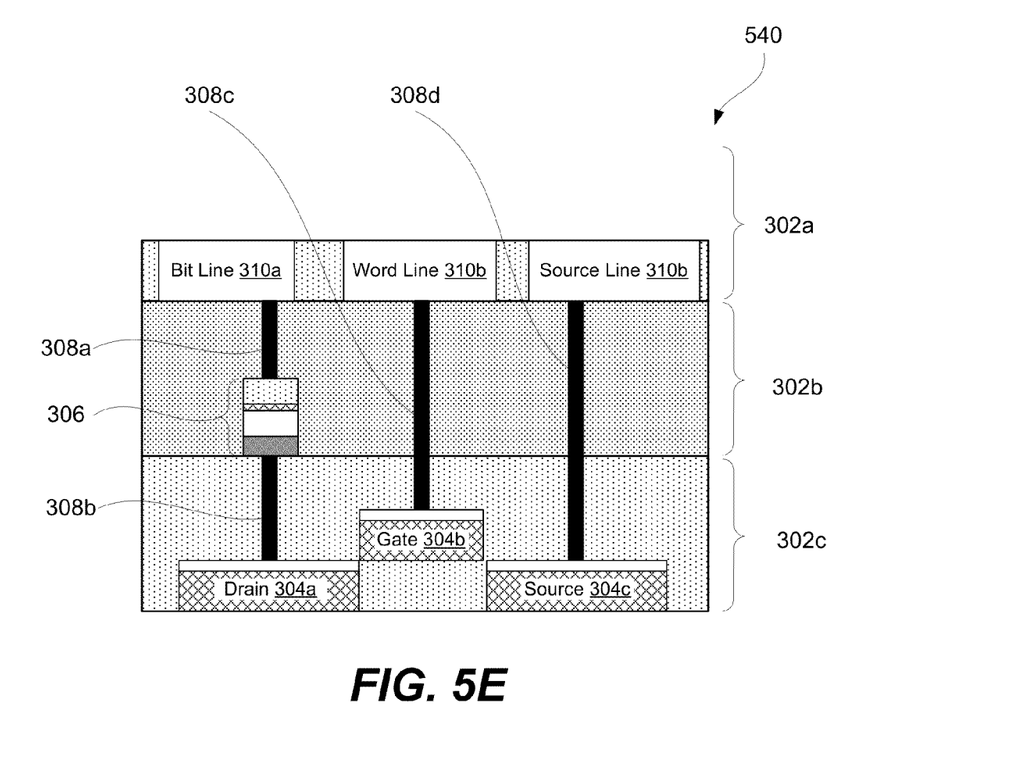

As discussed above, signal lines may be positioned in yet another ILD layer. As such, method 400 may proceed with deposing signal line level ILD layer during operation 416, etch trenches in this ILD layers using another mask during operation 418, and filling the trenches with a conductive material (e.g., copper) during operation 420. An example of a fully manufactured nonvolatile memory assembly after this operation is illustrated in FIG. 5E.

Figure 6:
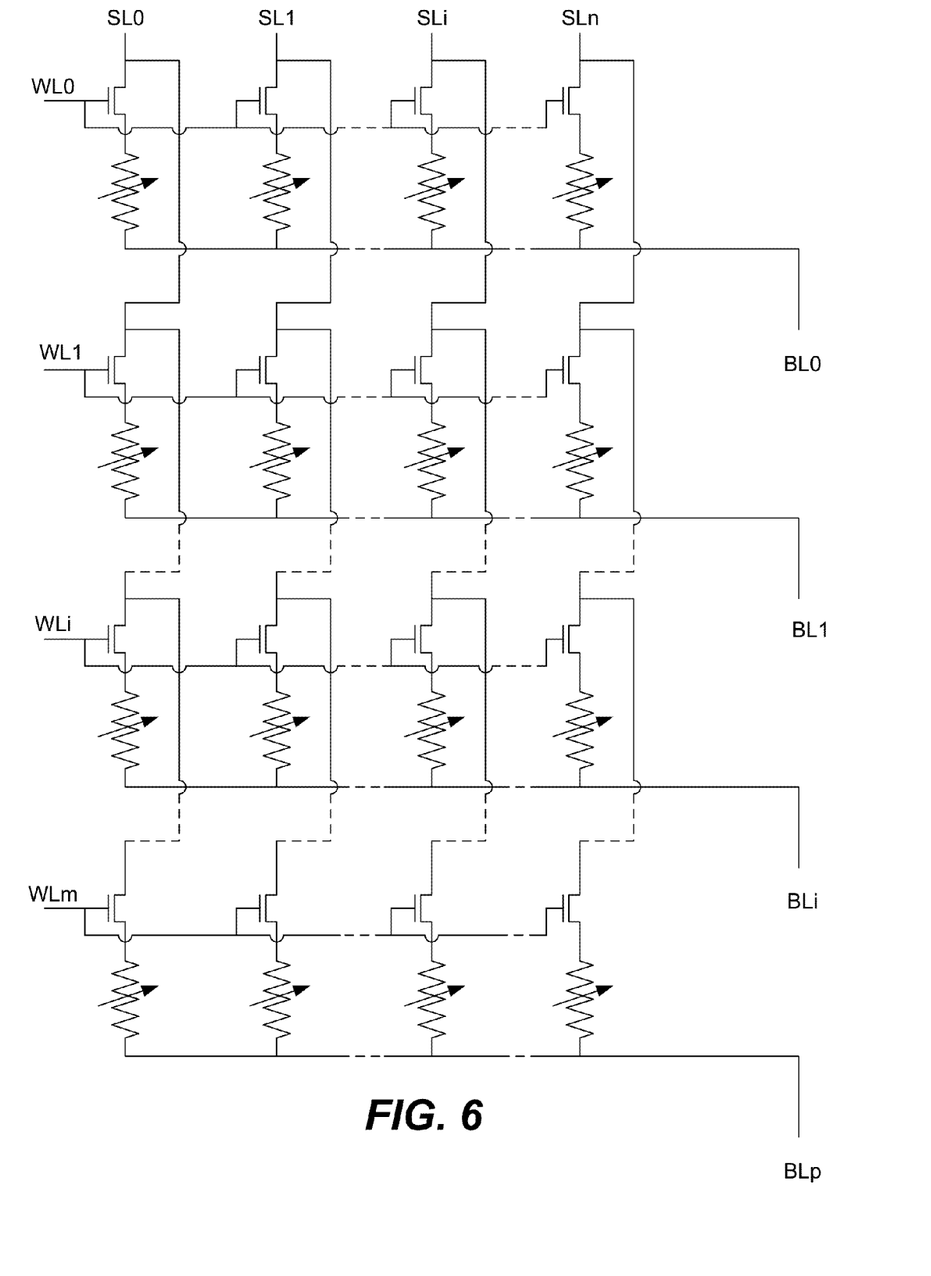
FIG. 6 illustrates an array of the nonvolatile memory assemblies, in accordance with some embodiments.

FIG. 6 illustrates an array of the nonvolatile memory assemblies, in accordance with some embodiments. The array is shown to include "n" bit lines and "m" word lines. In some embodiments, a number of word lines and/or a number of bit lines may be 256, 512, or 1024.

Figure 7:
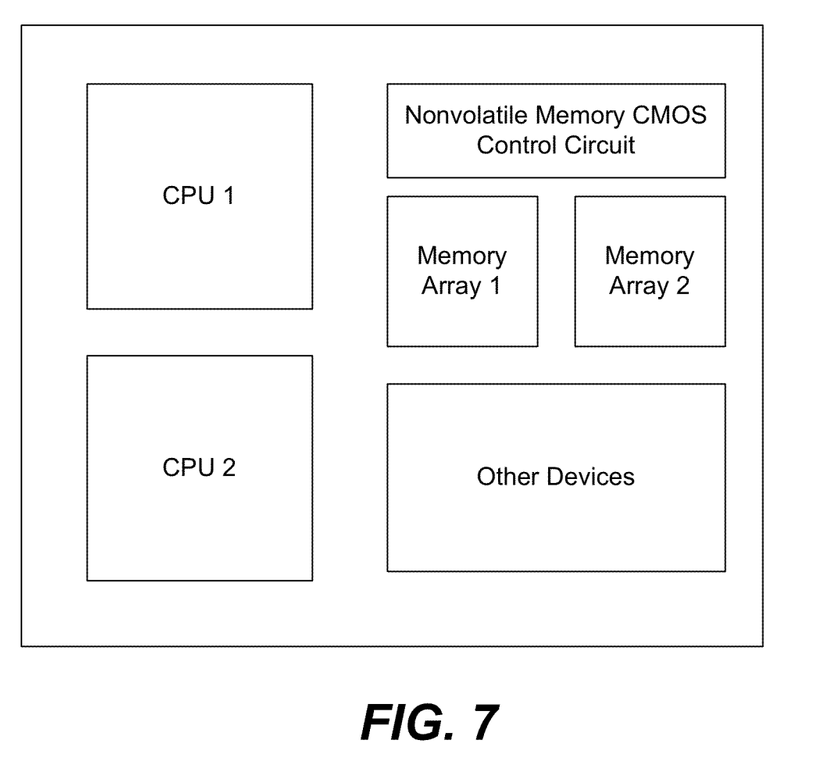
FIG. 7 illustrates a semiconductor device including two memory arrays, in accordance with some embodiments.

FIG. 7 illustrates a semiconductor device including two memory arrays, in accordance with some embodiments. In general, any number of memory arrays may be provided in the same device. One examples of the array is presented in FIG. 6 and described above. The memory arrays may be controlled by nonvolatile memory CMOS control circuit. As shown, the semiconductor device may include multiple central processing units (CPUs) and other devices.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A nonvolatile memory assembly comprising:
    a set of signal lines comprising a bit line, a word line, and a source line;
    a nonvolatile memory element comprising
        a first layer operable as a first electrode connected to the bit line and comprising titanium nitride,
        a second layer operable as a second electrode and comprising polysilicon, and
        a third layer comprising hafnium oxide having oxygen vacancies, wherein the third layer is provided between the first layer and the second layer; and
    a transistor comprising a source electrically connected to the source line, a gate electrically connected to the word line, and a drain electrically connected to the second layer of the nonvolatile memory element; and
    wherein the bit line, the word line, and the source line are located within a first interlayer dielectric (ILD) layer,
    wherein the nonvolatile memory element is located within a second ILD layer disposed under the first ILD layer, such that the bit line, the word line, and the source line are all disposed on one side of the nonvolatile memory element, and
    wherein the transistor is located within a third ILD layer disposed under the second ILD layer.

2. The nonvolatile memory assembly of claim 1, wherein the hafnium oxide of the third layer of the nonvolatile memory element has a stoichiometric formula of HfO$_x$ with X being between 1.7 and 1.9.

3. The nonvolatile memory assembly of claim 1, wherein the third layer of the nonvolatile memory element has a thickness of between 15 Angstroms and 100 Angstroms.

4. The nonvolatile memory assembly of claim 1, wherein the polysilicon of the second layer of the nonvolatile memory element comprises an n-dopant.

5. The nonvolatile memory assembly of claim 1, wherein the polysilicon of the second layer of the nonvolatile memory element comprises a dopant present at a concentration of between 1,019 and 1,020 atoms per centimeter cubed.

6. The nonvolatile memory assembly of claim 1, wherein the second layer of the nonvolatile memory element further comprises a sublayer at an interface with the third layer, the sublayer comprising silicon oxide.

7. The nonvolatile memory assembly of claim 1, wherein the second layer of the nonvolatile memory element has a thickness of between 100 Angstroms and 1,000 Angstroms.

8. The nonvolatile memory assembly of claim 1, wherein the first layer of the nonvolatile memory element has a thickness of between 200 Angstroms and 2,000 Angstroms.

9. The nonvolatile memory assembly of claim 1, wherein the first layer of the nonvolatile memory element is connected to the bit line using a contact comprising tungsten.

10. The nonvolatile memory assembly of claim 9, wherein the nonvolatile memory element further comprises a fourth layer operable as a diffusion barrier layer, the fourth layer being located between the first layer of the nonvolatile memory element and the contact.

11. The nonvolatile memory assembly of claim 10, wherein the fourth layer has a thickness of between 300 Angstroms and 800 Angstroms.

12. The nonvolatile memory assembly of claim 1, wherein a resistance between the source and the drain is controllable between about 1 kOhm and 1 MOhm by applying a potential to the word line.

13. The nonvolatile memory assembly of claim 1, wherein the hafnium oxide is configured to change its resistivity state when a voltage of less than 3.0V is applied to the third layer of the nonvolatile memory element.

14. The nonvolatile memory assembly of claim 1, wherein the nonvolatile memory element has a thickness of between 1,000 Angstroms and 5,000 Angstroms.

15. A nonvolatile memory assembly comprising:
a set of signal lines comprising a bit line, a first word line, a second word line, a first source line, and a second source line;
a nonvolatile memory element comprising a first layer operable as a first electrode connected to the bit line and comprising titanium nitride, a second layer operable as a second electrode and comprising polysilicon, and a third layer comprising hafnium oxide having oxygen vacancies, wherein the third layer is provided between the first layer and the second layer;
a first transistor comprising a first source electrically connected to the first source line, a first gate electrically connected to the first word line, and a first drain electrically connected to the second layer of the nonvolatile memory element; and
a second transistor comprising a second source electrically connected to the second source line, a second gate electrically connected to the second word line, and a second drain electrically connected to the second layer of the nonvolatile memory element
wherein the bit line, the first word line, the second word line, the first source line, and the second source line are located within a first interlayer dielectric (ILD) layer,
wherein the nonvolatile memory element is located within a second ILD layer disposed under the first ILD layer, such that the bit line, the first word line, the second word line, the first source line, and the second source line are all disposed on one side of the nonvolatile memory element, and
wherein the first transistor and the second transistor are located within a third ILD layer disposed under the second ILD layer.

16. The nonvolatile memory assembly of claim 15, wherein the first source line and the second source line are the same component of the nonvolatile memory assembly.

17. A method of operating a nonvolatile memory assembly, the method comprising:
providing the nonvolatile memory assembly comprising (i) a set of signal lines comprising a bit line, a word line, and a source line, (ii) a nonvolatile memory element comprising a first electrode connected to the bit line and comprising titanium nitride, a second electrode comprising polysilicon, and a resistive switching layer provided between the first and second electrodes and comprising hafnium oxide having oxygen vacancies, and (iii) a transistor comprising a source electrically connected to the source line, a gate electrically connected to the word line, and a drain electrically connected to the second electrode,
wherein the bit line, the word line, and the source line are located within a first interlayer dielectric (ILD) layer,
wherein the nonvolatile memory element is located within a second ILD layer disposed under the first ILD layer, such that the bit line, the word line, and the source line are all disposed on one side of the nonvolatile memory element, and
wherein the transistor is located within a third ILD layer disposed under the second ILD layer;
applying a first potential to the word line resulting in a first electrical resistance between the drain and the source being at a first level; and
maintaining the source line at a ground potential while applying a second potential to the bit line resulting in a first current of less than 100 microamperes flowing through the resistive switching layer and changing a resistive state of the hafnium oxide.

18. The method of claim 17, wherein the second potential is less than about 3.0 Volts.

19. The method of claim 17, further comprising:
applying a third potential to the word line resulting in a second electrical resistance between the drain and the source being at a second level that is smaller than the first level; and
maintaining the source line at the ground potential while applying a fourth potential to the bit line resulting in a second current flowing through the resistive switching layer, the second current being smaller than the first current and not changing the resistive state of the hafnium oxide; and
measuring the second current to determine the resistive state of the hafnium oxide.

20. The method of claim 17, wherein the fourth potential is less than 1.5 Volts.

* * * * *